US006966012B1

(12) United States Patent
Gandhi

(10) Patent No.: US 6,966,012 B1
(45) Date of Patent: Nov. 15, 2005

(54) MEMORY COLUMN REDUNDANCY CIRCUITRY AND METHOD FOR IMPLEMENTING THE SAME

(75) Inventor: Dhrumil Gandhi, Cupertino, CA (US)

(73) Assignee: Artisan Components, Inc., Sunnyvale, CA (US)

( * ) Notice: Subject to any disclaimer, the term of this patent is extended or adjusted under 35 U.S.C. 154(b) by 506 days.

(21) Appl. No.: 10/179,773

(22) Filed: Jun. 24, 2002

Related U.S. Application Data

(60) Provisional application No. 60/300,497, filed on Jun. 22, 2001.

(51) Int. Cl.[7] ........................ G06F 11/20; G06F 12/16; G11C 29/00

(52) U.S. Cl. .......................................... 714/7; 714/711

(58) Field of Search .................................... 714/7, 711

(56) References Cited

U.S. PATENT DOCUMENTS 5,255,227 A * 10/1993 Haeffele ..................... 714/718
6,507,524 B1 * 1/2003 Agrawal et al. ............ 365/200
6,745,354 B2 * 6/2004 Terzioglu .................... 714/710

FOREIGN PATENT DOCUMENTS

EP 477809 A2 * 4/1992 ........... G11C 29/00

OTHER PUBLICATIONS

Ilyoung Kim; Zorian, Y.; Komoriya, G.; Pham, H.; Higgins, F.P.; Lewandowski, J.L.; Built in self repair for embedded high density SRAM; Test Conference, 1998. Proceedings. International, vol., Iss., Oct. 18-23, 1998, pp.:1112-1119.*

Aitken, R. et al.; Redundancy, repair, and test features of a 90nm embedded SRAM generator; Defect and Fault Tolerance in VLSI Systems, 2003. Proceedings. 18th IEEE International Symposium on, Vol., Iss., Nov. 3-5, 2003; pp.: 467-474.*

* cited by examiner

*Primary Examiner*—R. Stephen Dildine
(74) *Attorney, Agent, or Firm*—Martine Penilla & Gencarella, LLP

(57) ABSTRACT

A column redundancy circuitry and a method for implementing the same are provided. One exemplary method provides routing for an access request addressed to a defective cell. The method includes providing a redundant column within a memory circuit, the redundant column in communication with a sense amplifier. Next, a defective cell of a memory circuit is located and the address is programmed. An access request is then processed, the access request containing the address of the defective cell Finally, the access request is routed to the redundant column through enable circuitry. Some notable advantages include the conservation of surface area of the memory circuit induced by locating the redundant column within the memory circuit. The externalization of the fuse box, Built In Self Repair region and the logic circuitry from the memory core also provide increased flexibility.

28 Claims, 9 Drawing Sheets

MEMORY COLUMN REDUNDANCY CIRCUITRY AND METHOD FOR IMPLEMENTING THE SAME

CROSS REFERENCE TO RELATED APPLICATIONS

This application claims priority from U.S. Provisional Patent Application No. 60/300,497 filed Jun. 22, 2001 and entitled "Memory Column Redundancy Circuitry and Method for Implementing the Same." This provisional application is herein incorporated by reference.

BACKGROUND OF THE INVENTION

1. Field of the Invention

This invention relates generally to integrated circuits and more particularly to circuit structures, methods of use, and apparatus implementing column redundancy in memory architectures.

2. Description of the Related Art

Semiconductor memory cores are typically laid-out in array format. The array structures are typically composed of $2^n$ by $2^m$ individual memory cells which are coupled to wordline (rows) and complementary pair bit lines (columns). A typical memory cell may be composed of transistors coupled together to form a data storage device. An individual memory cell is typically selected when an X-decoder is used to select rows and a Y-decoder is used to select columns.

In the manufacture of semiconductor memories, defects are frequently encountered. Such defects typically affect a small number of memory elements in the memory. To prevent rejection of an entire chip due to the presence of a comparatively small number of defective memory elements and to increase manufacturing process yield, typical semiconductor memory designs provide redundant memory elements arranged in well known bank architectures. Redundant memory elements are used as replacements for elements that, during testing of the memory device, are determined to be defective. Redundancy circuitry typically includes laser programmable fuses or other non-volatile memory elements suitable for storing address configurations corresponding to defective memory elements. For example, a defective row or column may be deselected and a redundant row or column assigned in its place. If done properly, the assignment of the redundant row or column is substantially transparent to a system utilizing the memory through the memory's addressing circuitry.

As mentioned above, defective rows or columns must be disabled to allow the circuit to function properly. Typically, to disable a defective row or column, redundancy circuits physically disable the defective row or column (e.g., by fusible links) or logically deselect the defective row or column (e.g., based on a defective row/column address stored in non-volatile memory). As it is common for fuse links to be located inside the memory circuitry, blowing a fuse using known laser systems becomes a slow and intricate process requiring expensive equipment.

Unfortunately, the redundant rows and columns of a redundant array that uses a bank architecture occupies valuable chip surface area and augments the unit cost of the integrated circuit. Moreover, the chip surface area occupied by the redundant array is a larger percentage of overall memory area for smaller memory configurations. In addition, the column replacement is performed by circuitry in the y-decode, i.e., at the column level, that is associated with each column in order to shift the data. The column replacement circuitry in the y-decode further occupies chip surface area.

As a result, there is a need to solve the problems of the prior art to allow for the reassignment of a defective column in real time through a simple and elegant modification of a memory integrated circuit without substantially increasing chip surface area demands or the cost of the device in light of the smaller memory configurations being produced.

SUMMARY OF THE INVENTION

Broadly speaking, the present invention fills these needs by providing a column redundancy circuitry and a method for implementing the same wherein the surface area required by the redundancy circuitry is minimized. It should be appreciated that the present invention can be implemented in numerous ways, including as an apparatus, a system, a device, or a method. Several inventive embodiments of the present invention are described below.

In one embodiment, a memory circuit is provided. In this embodiment, the memory circuit includes a memory core having an array of core cells, where the core cells are defined by a plurality of rows and columns. A redundant column containing core cells and juxtaposing the memory core is included where the redundant column extends substantially parallel with the plurality of columns of the memory core. An X decode circuitry region for addressing rows of the memory core and the redundant column is included where the X decode circuitry region extends with and is adjacent to the redundant column. The memory circuit includes a Y decode circuitry for addressing columns within an IO bit of the memory core, the Y decode circuitry including pre-charge circuitry. The memory circuit further includes a control circuit. Input/output (IO) circuitry is associated with each IO bit where the IO circuitry is configured to route an access request intended for a defective core cell to the redundant column is included with each column. Finally, a sense amplifier is associated with each IO bit and redundant column.

In another embodiment, a split core design memory circuit is provided. In this embodiment, a first memory core having an array of core cells is included where the array of core cells is defined by a plurality of rows and columns. A second memory core having an array of core cells where the array of core cells is defined by a plurality of rows and columns is also included. A redundant column containing core cells and juxtaposing one of the first memory core and the second memory core is also included where the redundant column extends substantially parallel with the plurality of columns of the memory core. An X decode circuitry region for addressing rows of the first and second memory cores and the redundant column is included where the X decode circuitry region extends with and is adjacent to the redundant column. Y decode circuitry for addressing physical columns of an IO bit within the first and second memory cores, where the Y decode circuitry contains pre-charge circuitry, is also included. The memory circuit includes a control circuit. IO circuitry associated with each IO bit is included where the IO circuitry is configured to route an access request intended for a defective core cell to the redundant column. Finally, a sense amplifier associated with each IO bit and the redundant column is included.

In yet another embodiment a split core design memory circuit is provided. In this embodiment, a first memory core having an array of core cells is included where the array of core cells is defined by a plurality of rows and columns. A second memory core having an array of core cells where the array of core cells is defined by a plurality of rows and columns is also included. A redundant column containing core cells and juxtaposing one of the first memory core and the second memory core is included where the redundant column extends substantially parallel with the plurality of columns of the memory core. Also included is a dummy column that is adjacent to the redundant column. An X decode circuitry region for addressing rows of the first and second memory cores and the redundant column where the X decode circuitry region extends with and is adjacent to the redundant column is included. Y decode circuitry for addressing columns of the memory core is included where the Y decode circuitry includes pre-charge circuitry. The memory circuit includes a control circuit. IO circuitry associated with each IO bit is included where the IO circuitry is configured to route an access request intended for a defective physical column to the redundant column.

In still another embodiment a method for routing an access request to a defective column in an array of a memory circuit is provided. The method includes providing a redundant column adjacent to a memory core within a memory circuit, where the redundant column is in communication with a sense amplifier. Next, a defective column within an array of a memory circuit is located. Then, an address of the defective column is programmed. Next, the access request is processed where the access request is directed for the defective column in the memory circuit. Finally, the access request is routed to the redundant column through enable circuitry within the memory circuit.

In another embodiment a memory circuit is provided. In this embodiment a memory core having an array of core cells is included where the core cells are defined by a plurality of rows and columns. Also included is a redundant column containing core cells where the redundant column is juxtaposing the memory core and extending substantially parallel with the plurality of columns of the memory core. IO circuitry associated with each IO bit is included. Each IO bit includes multiple columns that are accessed using Y decode. The IO circuitry is configured to route an access request intended for a defective column cells to the redundant column in response to a select signal that is activated when a defective column cell is accessed.

The advantages of the present invention are numerous. Most notably, the conservation of surface area of the memory circuit induced by locating the redundant column within the memory circuit liberates surface area otherwise designated for a redundant array. The externalization of the fuse box, Built In Self Repair (BISR) region and the logic circuitry from the memory core enhances the flexibility of the memory circuit. In addition, the split core design and the sharing of the redundancy column by the split cores maximizes device performance through the minimization of travel distances.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE PREFERRED EMBODIMENTS

An invention is described for implementing column redundancy circuitry and methods for operating the same. It will be obvious, however, to one skilled in the art, that the present invention may be practiced without some or all of these specific details. In other instances, well known process operations have not been described in detail in order not to unnecessarily obscure the present invention.

The embodiments of the present invention provide an apparatus and method for column redundancy circuitry that will provide for re-routing an access request to a redundant column of a memory array while minimizing the surface area occupied by the associated circuitry and minimizing the changes to existing memory implementations.

Figure 1A:
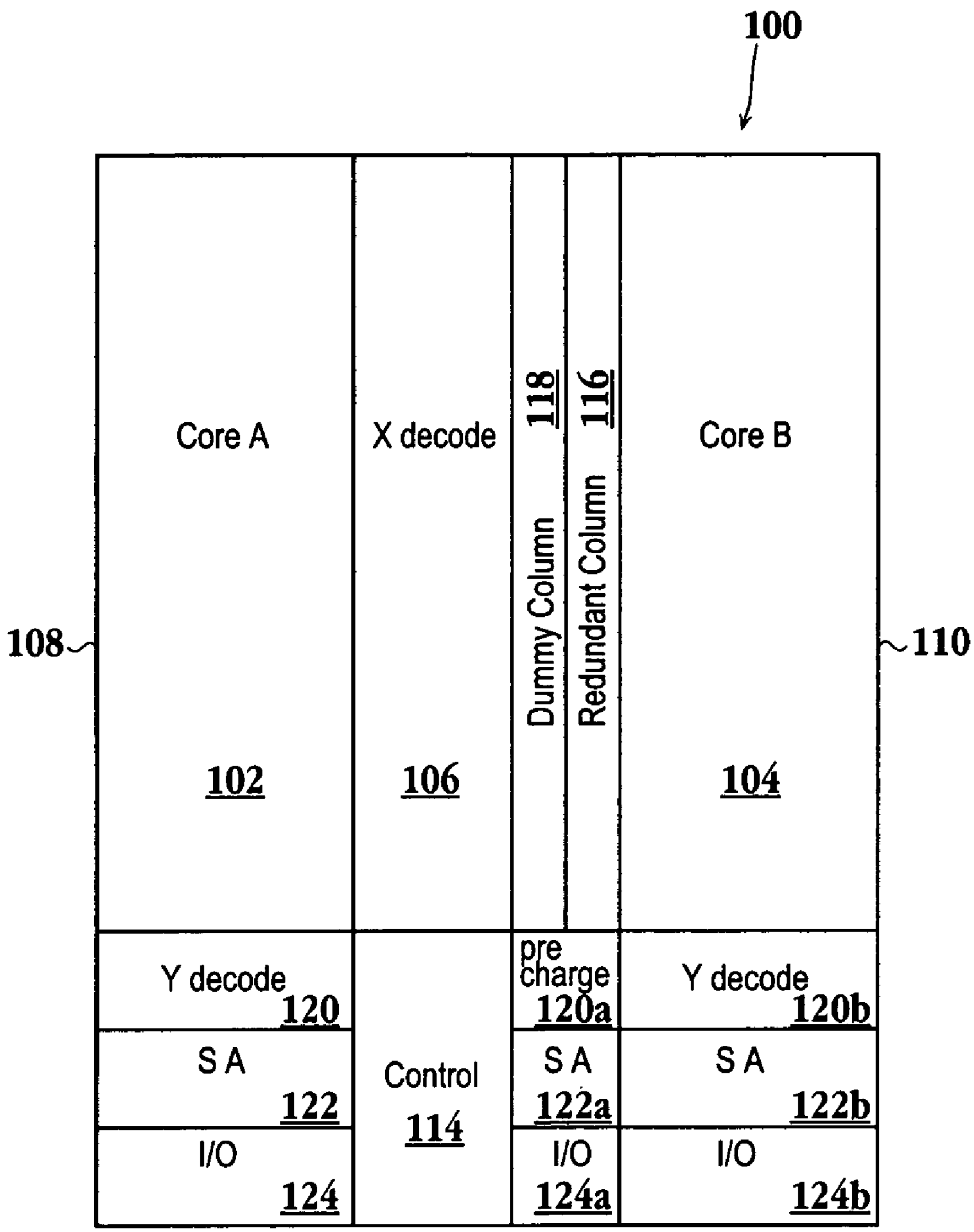
FIG. 1A illustrates a block diagram displaying a split core memory design and associated circuitry in accordance with one embodiment of the invention.

FIG. 1A illustrates block diagram 100 displaying a split core memory design and associated circuitry in accordance with one embodiment of the invention. Block diagram 100 displays memory Core A 102 and memory Core B 104. It should be appreciated that Core A 102 and Core B 104 contain a plurality of memory cells arranged in a row and column format. The memory 100 also contains an X decode (row decode) 106 which is shared by memory Core A 102 and memory Core B 104 in accordance with one embodiment of the invention. Core A 102 has an associated Y decode (column decode) 120. Y decoders enable multiple physical columns to be associated with one memory IO bit. A pre-charge circuitry (not shown) is embodied with the Y decode 120. As is well known, X decoders are used for addressing rows of the memory core. The Y decoders are used for addressing columns within a single IO bit of the memory core. Sense amplifier 122 is typically a circuit coupled to the bitlines (not shown) of the memory core through Y decoder circuitry, such that multiple physical columns can share the same sense amp as only one column is connected to the sense amp by the Y decoder circuitry. Input/output (IO) region 124 is positioned below sense amplifier 122 and contains circuitry described in greater detail in reference to FIGS. 2 and 3. In accordance with one embodiment of the invention, the memory circuit of diagram 100 contains control circuit 114. Control circuit 114 includes circuitry used to access particular core cells. In accordance with one embodiment of the invention, the control region includes circuitry that enables proper timing for access of a core cell.

Figure 3:
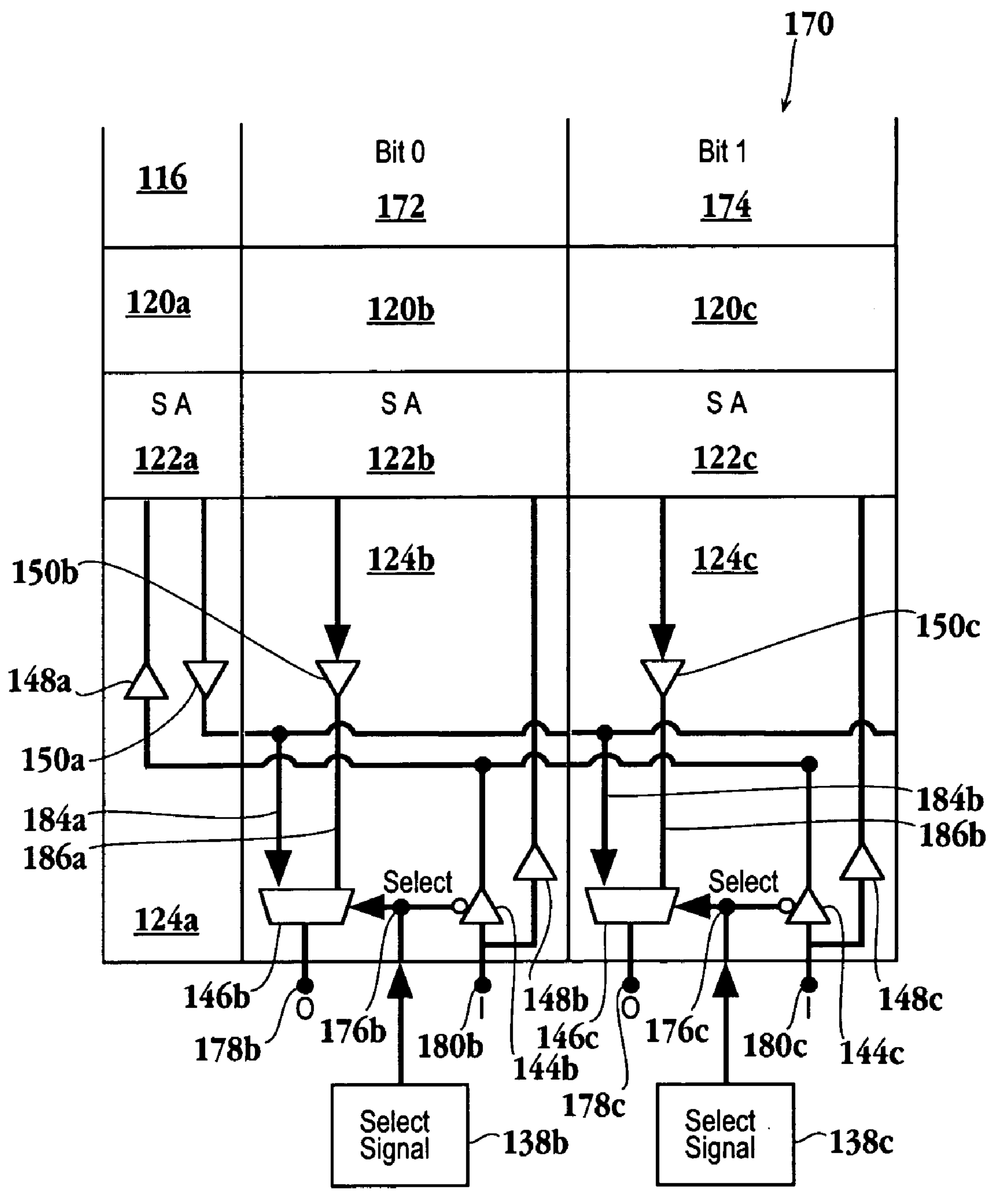
FIG. 3 illustrates a block diagram displaying a more detailed diagram of the enabling circuitry for a redundant column in accordance with one embodiment of the invention.
Figure 5A:
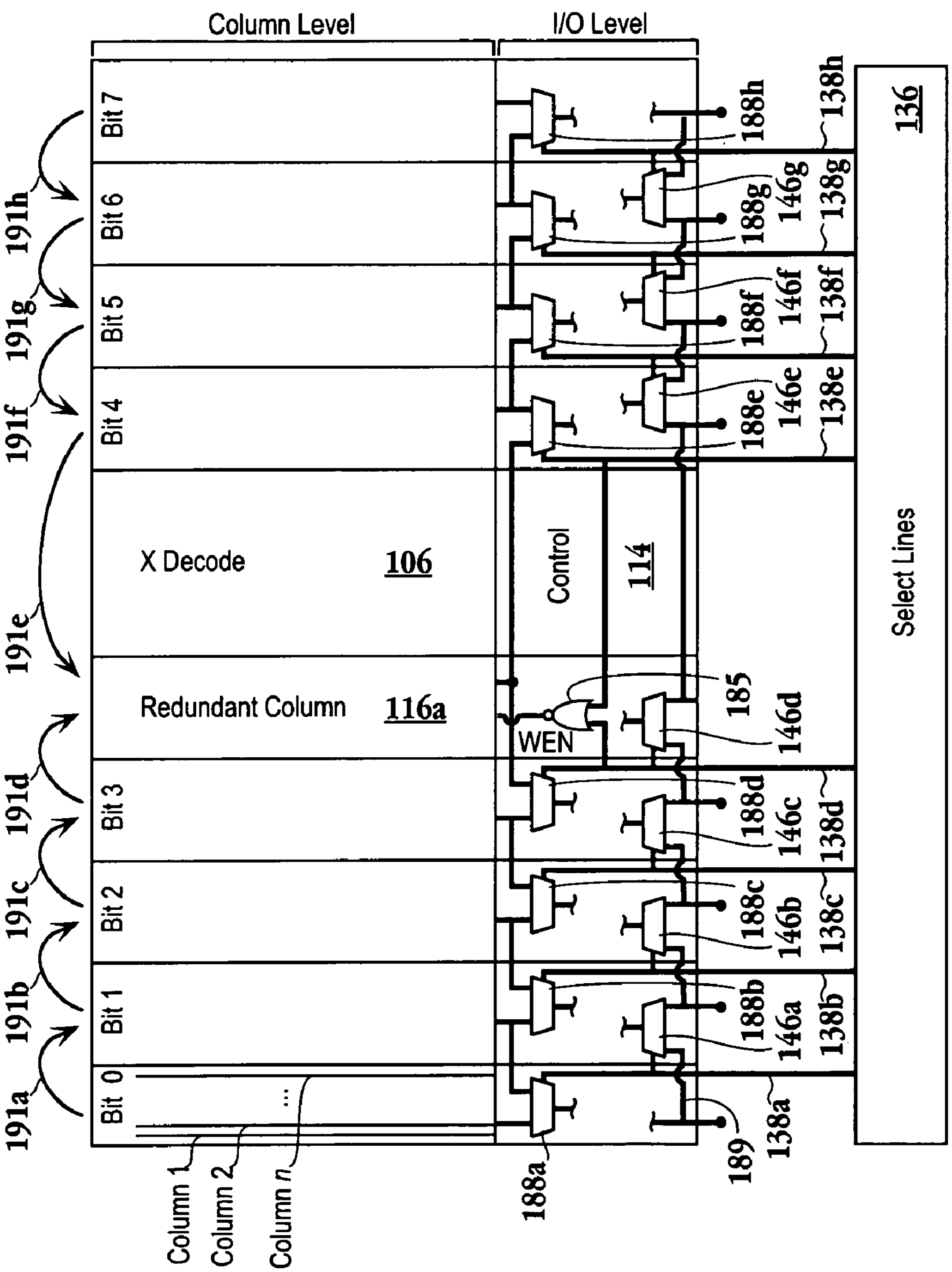
FIG. 5A is a simplified schematic of an alternative configuration of the enabling circuitry by shifting the columns at the IO level for a redundant column in accordance with one embodiment of the invention.
Figure 5B:
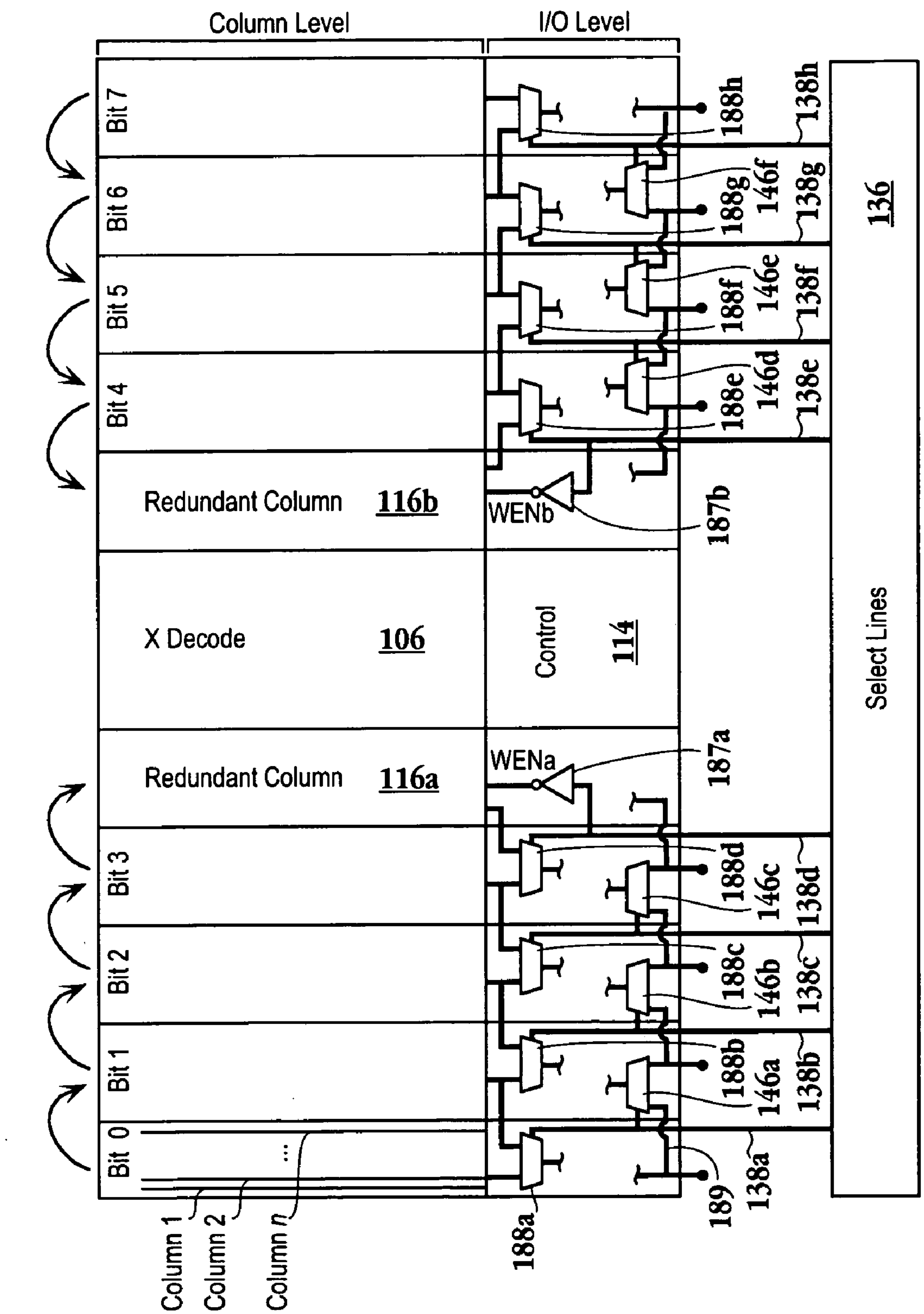
FIG. 5B is a simplified schematic of another alternative configuration of the enabling circuitry at the IO level for a redundant column in each core of the memory in accordance with one embodiment of the invention.

Continuing with FIG. 1A, Core B 104, similar to Core A 102, contains Y decode circuitry 120*b*, sense amplifier circuitry 122*b* and IO region 124*b*. As mentioned above a pre-charge circuitry (not shown) is included with Y decode 120*b*. Redundant column 116 and dummy column 118 are located between Core B 102 and X decode 106. Associated with redundant column 116, similar to Core A 102 and Core B 104, are pre-charge circuitry 120*a*, sense amplifier circuitry 122*a* and I/O region 124*a*. It should be appreciated that redundant column 116 is shared by memory Core A 102 and memory Core B 104, as Cores A and B function as one larger memory core. As such, redundant column 116 may utilize X decode 106 in accordance with one embodiment of the invention. The compact nature of locating the redundant column within the memory circuit conserves expensive chip surface area, as opposed to designing larger area consuming redundant arrays external to the memory circuit. Therefore, the conserved chip surface area may be allocated for another purpose, or simply will allow for the design of smaller more compact chips. In addition, by performing the column replacement directly with circuitry at the IO level, the IO level circuitry, as discussed with reference to FIGS. 3, 5A, and 5B, is less area consuming than the circuitry for performing column replacement in the Y decode, i.e., at the physical column level. Furthermore, the configuration of the circuitry for replacement of a faulty column at the IO level does not require a dedicated local sense amplifier for each physical column as in the prior art. Also, the IO level replacement circuitry can be added to an existing memory design such that redesign of the critical timing and sense amplifier circuitry is not required as would be the case with prior art.

For illustration purposes FIG. 1A depicts one redundant column 116, however, a plurality of redundant columns may be included in accordance with one embodiment of the invention. With one redundant column 116, as shown in FIG. 1A, a Y decode for the redundant columns is not needed. Should more than one redundant column be embodied in the circuit, then a Y decode would be placed with pre-charge circuitry 120*a*. Dummy column 118, which is used to isolate the memory core, may be used adjacent to one or more redundant columns, such that pre-charge 120*a*, sense amplifier 122*a* and Input/Output (IO) region 124*a* may extend past the border between redundant column 116 and dummy column 118. Therefore, pre-charge 120*a*, sense amplifier 122*a* and IO region 124*a* may extend horizontally into the area defined below dummy column 118 as depicted in FIG. 1A to minimize the silicon area. It should be appreciated that the extension of pre-charge region 120*a*, sense amplifier region 122*a* and IO region 124*a* is not limited to the entire region under dummy column 118 as depicted in FIG. 1A. For example, any one of the three previously mentioned regions or any combination thereof, may extend into a portion of the area defined under the dummy column. In accordance with another embodiment of the invention, additional dummy columns (not shown) may be located on either sides 108 and 110 of memory Cores A and B, respectively, so as to surround either, or both, of the memory Cores A and B, and can be similarly configured to accommodate redundant column circuitry and minimize area. As mentioned previously, redundant column or columns 116 will share X decode 106.

Figure 1B:
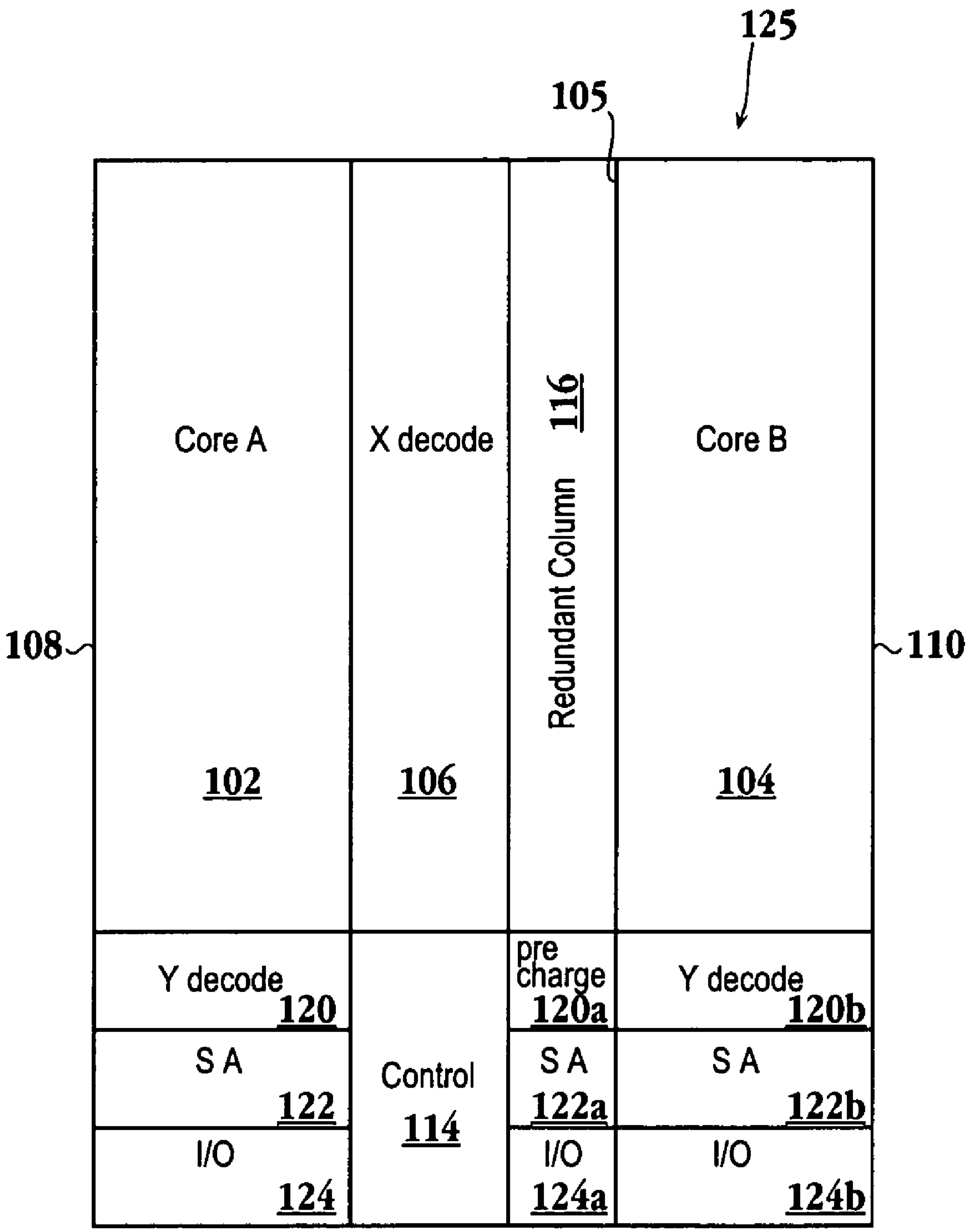
FIG. 1B illustrates a block diagram displaying a memory core and associated circuitry without a dummy column in accordance with one embodiment of the invention.

FIG. 1B illustrates block diagram 125 displaying a split design memory core and associated circuitry in accordance with one embodiment of the invention. FIG. 1B is identical to FIG. 1A except that FIG. 1B eliminates dummy column 118. It should be understood that while FIG. 1B depicts Core A 102 and Core B 104 sharing X decode 106, the memory circuit of diagram 125 may contain only one core in accordance with one embodiment of the invention. For example, by eliminating Core A 102 and associated circuitry regions of Y decode 120, sense amplifier 122 and IO region 124, the memory circuit of diagram 125 would then contain only one core, i.e., Core B. However, the split core design sharing the X decode provides for more efficient processing and the reduction of delays for the memory circuit.

In accordance with one embodiment of the invention, redundant column 116 and associated circuitry of pre-charge 120*a*, sense amplifier 122*a* and IO region 124*a* are juxtaposed with Core B 104 sharing a common boundary 105 in a side by side design, as depicted in FIG. 1B. It should be appreciated that redundant column 116 and associated circuitry may be positioned against the opposite side 110 of Core B 104 or the opposite side 108 of Core A 102. It is understood that by positioning redundant column 116 in close proximity to Core A 102 and Core B 104, such as sharing common boundaries or a side by side design, allows for a more efficient process within the memory circuit. The split core design and sharing of the redundant column positioned between the split cores further assists in minimizing signal distance, thereby enhancing response time.

Figure 2A:
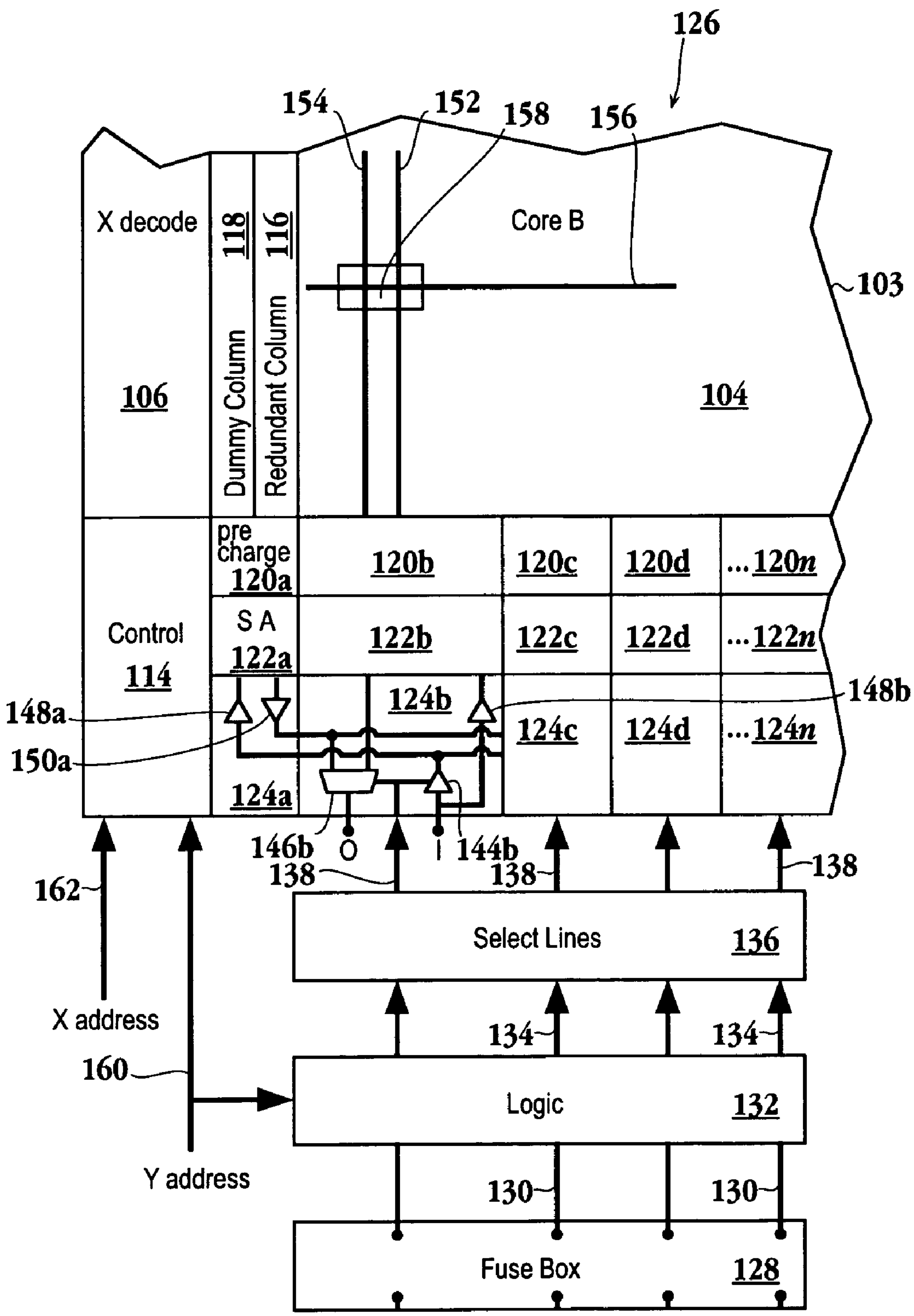
FIG. 2A illustrates a block diagram depicting a more detailed display of a memory circuit and associated external logic and circuitry in accordance with one embodiment of the invention.

FIG. 2A illustrates block diagram 126, depicting a more detailed display of a memory circuit and associated external logic and circuitry in accordance with one embodiment of the invention. Diagram 126 illustrates memory Core B 104. For illustration purposes one memory core is shown in FIG. 2A, however, the split core design as illustrated in FIGS. 1A and 1B may be utilized as well. Contained within memory Core B 104 are a plurality of rows and columns defining an array of core cells. In accordance with one embodiment of the invention, each column contains a pair of bit lines and each column is associated with an IO bit. For example, bit lines 152 and 154 intersect with wordline 156 to define core cell 158. As will be explained below, if core cell 158 is found to be defective, an access request addressing core cell 158, or any other cells located physically within the same column or the array, may be routed to the redundant column 116. As illustrated in diagram 126, redundant column 116 is juxtaposed with Core B 104, thereby sharing a common boundary. In addition, redundant column 116 extends substantially parallel to bit lines 152 and 154 of Core B.

Continuing with diagram 126, bit lines 152 and 154 interface with Y decode and pre-charge circuitry 120*b*. In accordance with one embodiment of the invention, sense amplifier circuitry 122*b* is located between Y decode region 120*b* and IO region 124*b*. IO region 124*b* houses circuitry capable of being enabled for routing an access request addressing a column containing one or more defective cells, such as cell 158, to the redundant column 116. The circuitry of IO region 124*b* will be explained in more detail in reference to FIG. 3.

In accordance with one embodiment of the invention, IO region 124*b* of FIG. 2A is configured to receive a select input 138 from select lines region 136. A logic region 132 provides signals to activate replacement circuitry by comparing the information for location of defective column within Core B 104 with the address input during each access. If any access is directed towards the defective column, then the replacement circuitry is activated through the select lines. For example, if cell 158 of Core B is defective, Y address 160 is input into the logic region 132 in accordance with one embodiment of the invention and compared to the defective column address programmed into the Fuse Box 128. It should be appreciated that following the completion of the manufacturing of the memory circuit of diagram 126, the circuit is tested to determine in any cells are defective. Should any defective cells be found their column location is determined for programming fuse box 128 that communicates with logic region 132. The defective column address contains the Y address of the column as well as the location of the IO bit that column is associated with.

Fuse box 128 of FIG. 2A is externally located from the memory Core B 104 and the core region 103. It will be apparent to one skilled in the art that placement of fuse box 128 and logic region 132 external to the memory core allows for a more dense memory core. In one embodiment of the invention, fuse box 128 is programmed to output the column location for the defective cell 158. Fuse box 128 interfaces with logic region 132. In accordance with one embodiment of the invention, logic region 132 is configured to receive Y address input 160 of memory core 104. Logic region 132 contains circuitry to compare or recognize whether Y address input 160 is an address of a defective cell within Core B 104, in one embodiment. For example, if an access request is directed to an address of a defective cell, such as cell 158, then the logic circuitry activates select signal 138 which enables a path to redundant column 116. In accordance with one embodiment of the invention, logic region 132 may be in communication with select lines region 136 through communication lines 134, which can be in the form of any electrical connection. For example, upon recognition of an access request directed to Y address 160 of a defective cell, logic region 132 will trigger select lines region 136 to generate select signal 138 for the appropriate bit.

In FIG. 2A bit 0 contains the column with the defective cell. Accordingly, select signal 138 is generated for bit 0 when an access request is addressed to the defective cell in accordance with one embodiment of the invention. In another embodiment of the invention, each bit of memory Core B is associated with a select signal 138. It should be appreciated that select signals 138 are not activated when accessing other, non-defective, columns of the arrays that are associated with the memory bit 0. In accordance with one embodiment of the invention, select signal 138 is in communication with enable buffer 144*b* and multiplexer (MUX) 146*b* of IO region 124*b* of bit 0. The operation of the enabling circuitry of IO region 124*b* will be explained in more detail in reference to FIG. 3.

Continuing with FIG. 2A, control region 114 of FIG. 2A is shown receiving inputs for X address 162 and Y address 160. In accordance with one embodiment of the invention, the control region includes circuitry that enables proper timing for access of a core cell of Core B 104. It should be appreciated that an access request for a core cell may be for the purpose of reading from or writing to the core cell. Additionally, FIG. 2A depicts logic region 132 and fuse box 128 as external from the core region 103. Externalization of the logic region 132 and the fuse box 128 allows for enhanced flexibility. It is understood that while core region 103 of FIG. 2A depicts redundant column 116 and dummy column 118, there may exist a plurality of redundant columns in accordance with one embodiment of the invention. For the embodiment of the invention where there are a plurality of redundant columns, it is understood that there would need to be Y decode circuitry included with precharge region 120*a*. In accordance with another embodiment of the invention, column 118 is eliminated.

Furthermore, as displayed in FIG. 2A, redundant column 116 and dummy column 118 are located between Core B 104 and X decode 106. However, redundant column 116 and/or dummy column 118 may be located on the opposite side of Core B 104 in accordance with one embodiment of the invention. It should further be appreciated that Y decode and pre-charge region 120*b*, sense amplifier circuitry 122*b* and IO region 124*b* associated with bit 0, is repeated any number of times for different size memories. For example, bit n of a plurality of a plurality of bits would be associated with Y decode and pre-charge region 120*n*, sense amplifier circuitry 122*n* and IO region 124*n*. In accordance with one embodiment of the invention, redundant column 116 and/or dummy column 118 may be located adjacent to a second memory core in a split core design such as core A of FIG. 1A and FIG. 1B.

It should be appreciated that the above method is used to replace one single defective bit cell, multiple defective bit cells or alternatively, the entire set of bit cells associated with one single physical column if the set of bit cells are defective. This is possible since an entire column is replaced when it contains one or more defective bit cells.

Figure 2B:
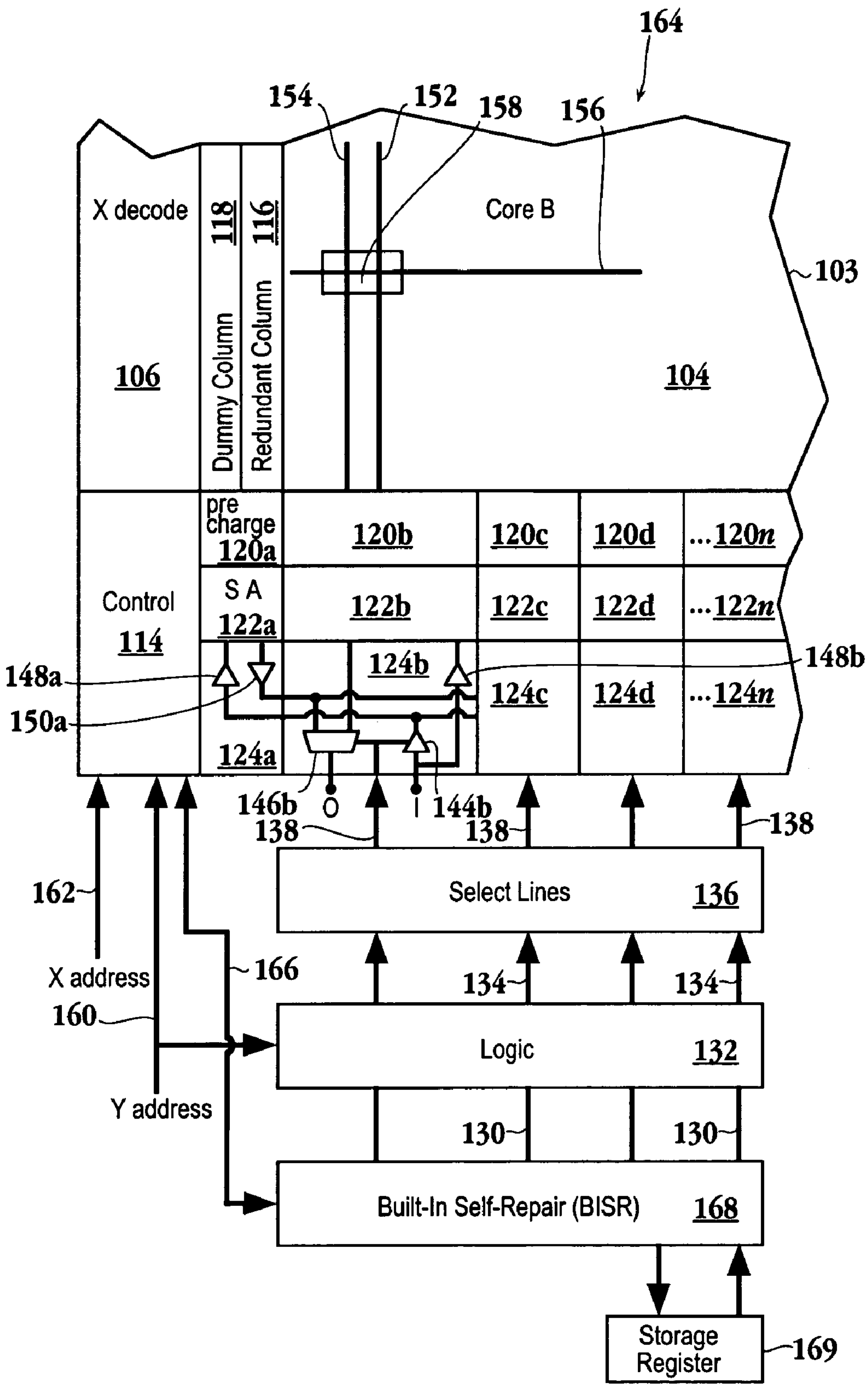
FIG. 2B illustrates a block diagram depicting a more detailed display of a memory circuit and external logic and Built In Self Repair (BISR) circuitry in accordance with one embodiment of the invention.

FIG. 2B illustrates block diagram 164, depicting a more detailed display of a memory circuit and external logic and Built In Self Repair (BISR) circuitry in accordance with another embodiment of the invention. FIG. 2B is equivalent to FIG. 2A with the exception of BISR region 168 and storage register 169 in place of a fuse box. In accordance with one embodiment of the invention, BISR region 168 includes on-chip circuitry which automatically tests a memory array such as Core B 104. It should be understood that BISR region 168 may be utilized with the split core design. In addition, BISR region 168 may perform a soft-repair, i.e., automatically utilizing the redundant elements (i.e., redundant column(s)) within a memory array to replace bad or defective memory bits. It should be appreciated that a self repair algorithm of the BISR region will eliminate the need to program fuses. Although, a built-in self test (BIST) operation will have to be performed at power up each time to identify the defective cells.

FIG. 2B further includes communication line 166 between BISR 168 and control circuitry 114. As BISR 168 includes the BIST on-chip circuitry for testing the memory array, the BISR communicates to the control circuit 114 for timing and to coordinate when the BISR is in testing/repair mode, in accordance with one embodiment of the invention. In this embodiment of the invention, when a defective cell is identified the address of the defective cell may be stored in a storage device, such as a storage register 169.

FIG. 3 illustrates block diagram 170 displaying a more detailed diagram of the enabling circuitry for a redundant column in accordance with one embodiment of the invention. For illustration purposes, diagram 170 depicts bit 0 172 of memory Core B, with associated Y decode circuitry 120*b*, sense amplifier circuitry 122*b* and an IO region 124*b* adjacent to redundant column 116. A defective core cell such as core cell 158 of FIGS. 2A and 2B may be contained in the column associated with bit 0 172. In accordance with one embodiment of the invention, IO region 124*b* receives input 180*b*, output 178*b* and select signal 138*b*. As mentioned above, the fuse box or BISR with reference to FIGS. 2A and 2B, can be programmed to identify a defective cell located within bit 0 172.

It should be appreciated that one select signal 138*b*–138*n* is associated with bit 0 to bit n, respectively. Focussing on bit 0, the select signal 138*b* interfaces with enable buffer 144*b* and mutliplexer (MUX) 146*b*. In accordance with one embodiment of the invention, enable buffer 144*b* may be a tri-state buffer and the like. In order to re-route an input addressed to a defective cell present in bit 0 172, wherein the location of the defective cell or column has been programmed, select signal 138*b* may be generated for bit 0 in accordance with one embodiment of the invention. It should be appreciated that select signal 138*b* via select line 176*b* allows enable buffer 144*b* to permit input 180*b* to pass through enable buffer 144*b* to the input buffer 148*a* of 10 region 124*a* associated with redundant column 116. Input 180*b* is then routed to the memory cells of redundant column 116, thereby replacing the one or more defective cells within the same column of bit 0. Although input 180*b* still goes to the column containing defective cell or cells, no activity of value occurs since it is replaced by the memory cells in the redundant column by the replacement logic.

In a similar fashion, output 178*b* of FIG. 3 may be received from a core cell of redundant column 116 which replaces a defective cell of bit 0, select signal 138*b* is generated for bit 0. Select signal 138*b* via select line 176*b* directs MUX 146*b* to permit signal 184*a* to pass through to output 178*b*. It should be appreciated that without select signal 138*b* the MUX 146*b* would allow signal 186*a* to pass. Signal 184*a* emanates from enable buffer 150*a* of IO region 124*a* associated with redundant column 116. In accordance with one embodiment of the invention, select signal 138*b* activates enable buffer 144*b* and MUX 146*b* to permit signals to and from the core cells of redundant column 116. As mentioned previously, data may be written to and read from the core cells of redundant column 116. One skilled in the art will appreciate that the static logic is outside the memory core. That is, select signal 138, which determines whether the redundant column is being addressed, is derived from outside thereby allowing the memory to be dense.

Continuing with FIG. 3, it should be appreciated that equivalent circuitry is repeated for each IO region 124*b*–124*n* associated with each bit of the core cell. For example, if Bit 1 contained a defective core cell, select signal 138*c* would activate enable buffer 144*c* and/or MUX 146*c* to permit communication with the redundant column 116. While FIG. 3 provides one redundant column 116, there may be a plurality of redundant columns in accordance with one embodiment of the invention. As mentioned above where a plurality of redundant columns are provided, precharge region 120*a* would include Y decode circuitry. It should be appreciated that for the situation where there are a plurality of redundant columns, the enable circuitry may be implemented for each redundant column. An alternative structure for performing column repair directly at the IO level is explained with reference to FIGS. 5A and 5B.

Figure 4:
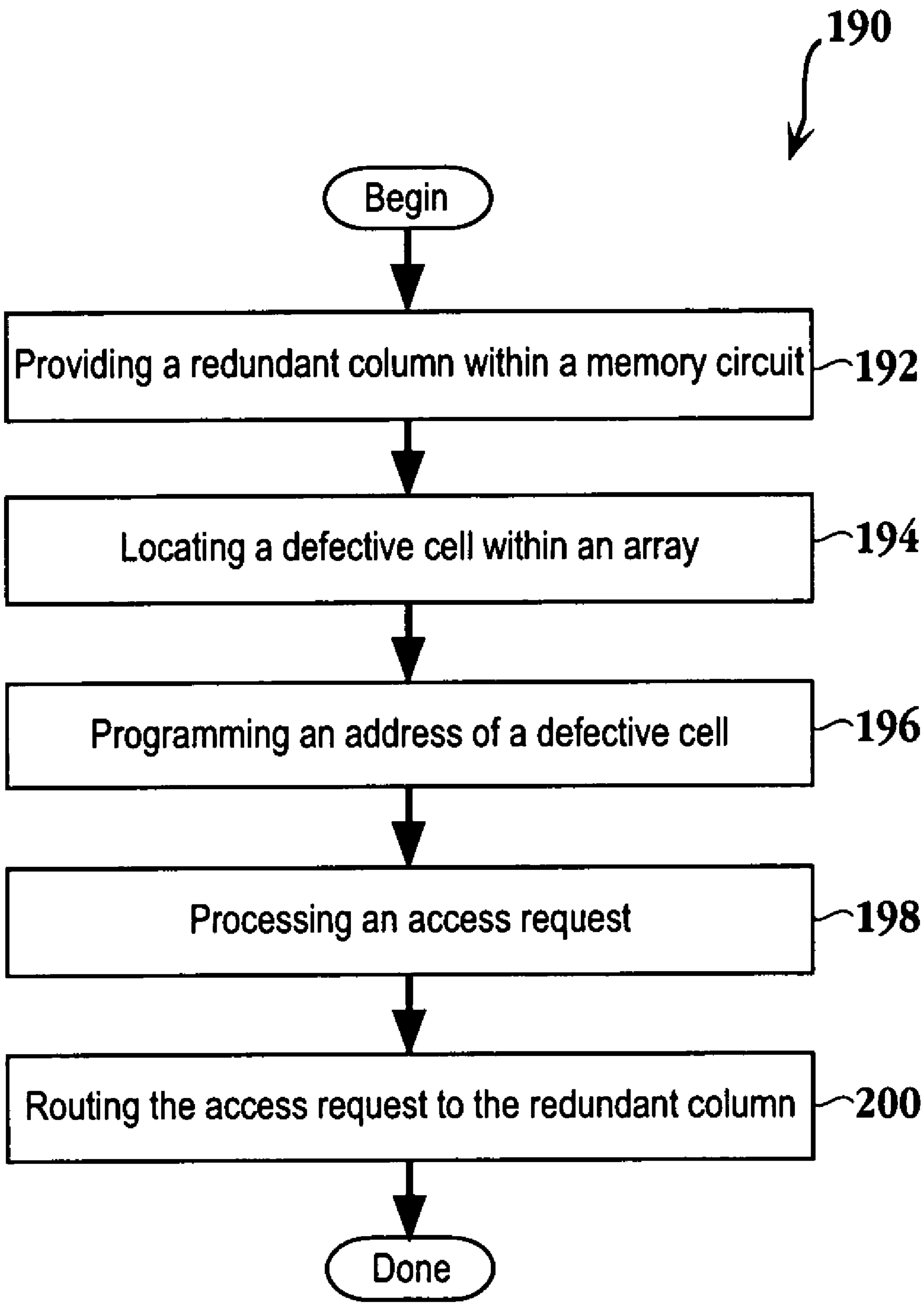
FIG. 4 illustrates a flowchart depicting a method for implementing column redundancy circuitry in accordance with one embodiment of the invention.

FIG. 4 illustrates a flowchart 190 depicting a method for implementing column redundancy circuitry in accordance with one embodiment of the invention. Flowchart 190 initializes with operation 192 where a redundant column within a memory circuit is provided. In accordance with one embodiment of the invention, the redundant column shares a boundary with an array of memory cells as depicted in FIGS. 1A–3. In accordance with another embodiment of the invention, the redundant column may be located next to a dummy column.

Continuing with Flowchart 190, the method next proceeds to operation 194 where a defective cell within a memory array is located. In accordance with one embodiment of the invention, the defective cell may be identified by testing with external test equipment. In accordance with another embodiment of the invention, the location of the defective cell can be identified and repaired using BISR circuitry with reference to FIG. 2B. Next, the method proceeds to operation 196 where the address of the defective cell is programmed. It can be appreciated that the address of the defective cell may be programmed through the process of blowing selected fuses of a fuse box with a laser or other suitable programming techniques. In accordance with one embodiment of the invention, the BISR employs a self repair algorithm that takes advantage of the on-chip processor to automatically identify and route around defective memory cells. In addition, a storage register can be provided to store the location of the defective cells. In one embodiment, the data stored in the storage registers can be written to non-volatile memory so that the locations of the defective cells can be stored for all future access to the memory. In such a case, the BIST operation would not be performed each time at power-up, although the re-routing of the BISR would still be needed so that bad cells can be re-routed to the redundant column using the select circuitry of the select lines.

Proceeding with flowchart 190, the method advances to operation 198 where an access request is processed. Here, the access request may be a query to read from or write to the address of the defective cell in accordance with one embodiment of the invention. The address request may be processed through logic circuitry where the address destination of the access request is checked to determine whether the address matches the address of a defective cell in accordance with one embodiment of the invention. Flowchart 190 terminates with operation 200 where the access request is routed to a redundant column. In accordance with one embodiment of the invention, the access request may be routed to a redundant column in response to recognizing the destination address for the access request as the address of the defective cell. In accordance with another embodiment of the invention, the access request is routed to the redundant column via enable circuitry as discussed in reference to FIG. 3.

FIG. 5A is a simplified schematic of an alternative configuration of the enabling circuitry by shifting the columns at the IO level for a redundant column in accordance with one embodiment of the invention. Select signals 138*a*–138*h* are activated based on external logic that determines when a faulty column is being accessed. For example, if the column associated with IO bit 0 is faulty, the data which is addressed to the faulty column is shifted to the corresponding column in the next IO bit, bit 1, by the enabling circuitry. More particularly, multiplexers 146*a*–146*d* in conjunction with select signals 138*a*–138*d* shift the data over one column as indicated by arrows 191*a*–191*d*. Thus, if a column in bit 0 is defective, input 189 is sent to bit 0 and bit 1 and select signal 138*a* is configured to cause multiplexer 146*a* to output the signal from input 189 when the defective column in bit 0 is accessed, i.e., shift the data over one IO bit. Likewise, output from the columns are configured so that the data is correctly obtained whether or not a shift has occurred due to a faulty column. Continuing with the example of the column within IO bit identified as bit 0 as being faulty, multiplexers 188*a*–188*d*, in conjunction with select signal 138*a*–138*d*, select the data from the appropriate column for output based upon the shift due to the faulty column. It should be appreciated that Bit O-Bit 3 correspond to Core A, while Bit 4-Bit 7 correspond to Core B of FIGS. 1A and 1B. One skilled in the art will appreciate that if there are two faulty columns, i.e., two columns need repair, a three input multiplexer is required for a two column shift. Similarly, for a three column repair, a four input multiplexer is required, and so on. It should be appreciated that multiple columns are contained within each bit, as illustrated in bit 0. It will be apparent to one skilled in the art that the number of columns contained within a bit is typically 4, 8, 16, 32, 64, etc. Thus multiple columns are associated with a single IO bit with Y decode of many to one.

Still referring to FIG. 5A, if column identified as bit 7 is faulty then multiplexers 146*e*–146*g* in conjunction with select signals 138*e*–138*h* shift the input data over one IO bit as indicated by arrows 191*e*–191*h*. It should be appreciated that output data is similarly shifted through multiplexers 188*e*–118*h*. Accordingly, if any column in the memory configuration is found to be faulty, it can be then replaced by the enabling circuitry, i.e., multiplexers and select signals, by shifting the data over one column toward redundant column 116*a*. As mentioned above, if n columns are defective then multiplexers having n+1 inputs are required to shift the data. NOR gate 185 is associated with redundant column 116*a* to disable a write enable signal (WEN) for the redundant column when both the select signals for bit 3 and bit 4 are inactive. WEN is a signal available at each IO bit level and thus within each redundant bit IO. WEN is used to disable writes to the redundant column when on of the non-defective columns is addressed or when the memory is defect free. Therefore, if the adjacent select lines are not active, the redundant IO bit is disabled.

FIG. 5B is a simplified schematic of another alternative configuration of the enabling circuitry at the IO level for a redundant column in each core of the memory in accordance with one embodiment of the invention. Here, redundant columns 116*a* and 116*b* are located on each side of X decode 106. As mentioned above, bits 0–3 correspond to core A, while bits 4–7 correspond to core B of FIGS. 1A and 1B. If one of the columns on the left hand side of X decode 106 is faulty, then the enabling circuitry, i.e., the multiplexers and the select signals, is configured to shift data over one IO bit towards redundant column 116*a*. In a similar fashion, if one of the columns on the right hand side of X decode 106 is faulty, then the enabling circuitry, i.e., the multiplexers and the select signals, is configured to shift data over one IO bit towards redundant column 116*b*. In this configuration the redundant column acts as a stop for each core. While FIGS. 5A and 5B illustrate an 8 bit memory configuration, it should be appreciated that this is not limiting as the embodiments described herein can be applied to an 8 bit, 16 bit, 32 bit, etc. memory configuration. It should be appreciated that the embodiments of FIGS. 5A and 5B eliminate the tri state buffers of the embodiment of FIG. 3, thereby having less circuitry for the signal pathway. Redundant columns 116*a* and 116*b* are each associated with an inverter 187*a* and 187*b*, respectively. Inverters 187*a* and 187*b* output write enable signals WENa and WENb, respectively. Here redundant column write enable signals are driven by an adjacent column select signal through the inverter. That is, select signal 138*d* drives WENa for column 116*a* and select signal 138*e* drives WENb for column 116*b*. As described with reference to FIG. 5A, the write enable signals are used to disable writes to the redundant column when one of the non-defective columns is addressed or when the memory is defect free. Therefore, if the adjacent select line to the redundant column (116*a* or 116*b*) is not active then the redundant IO bit is disabled for the respective redundant column.

It should be appreciated that while redundant columns 116*a* and 116*b* are adjacent to x decode, the redundant columns can be located anywhere within or adjacent to the corresponding memory core. The embodiments with reference to FIGS. 5A and 5B differ from the embodiment of FIG. 3 in that multiplexers are used to achieve the data shift when a faulty column is accessed in FIGS. 5A and 5B, while the embodiment of FIG. 3 utilize tri-state buffers due to the relatively long lines of the embodiment illustrated in FIG. 3. However, in either embodiment the column replacement occurs at the IO level without changing the circuitry of the memory core.

In one embodiment, optimum placement and utilization of the techniques of the present invention is implemented utilizing a generator. The generator should be generally understood to include one or more generators, each generator can be specifically optimized for a particular task. Such tasks or sub-tasks, for example, can include generating memory core columns redundant columns within the core, wherein the core and redundant columns are associated with circuitry at the IO level for repair of defective columns.

Figure 6A:
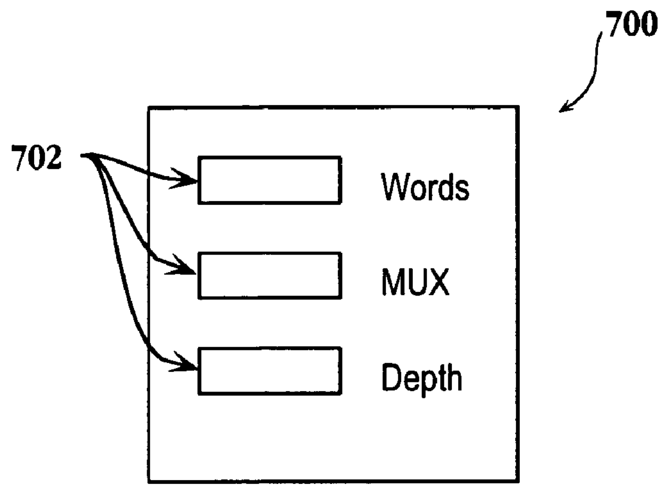
FIG. 6A is a block diagram showing an exemplary simplified memory generator graphical user interface (GUI) front end 700, in accordance with an embodiment of the present invention.

FIG. 6A is a block diagram showing an exemplary simplified memory generator graphical user interface (GUI) front end 700, in accordance with an embodiment of the present invention. The exemplary memory generator GUI 700 illustrates one view utilized for entering parameters into fields 702 to define a particular memory application. Broadly speaking, the memory generator checks the validity of the entered data and executes appropriate generators to define the memory application. After receiving data utilizing the GUI front end view 700, a memory generator of the embodiments of the present invention processes the data utilizing a memory generator backend, as described next with reference to FIG. 6B.

Figure 6B:
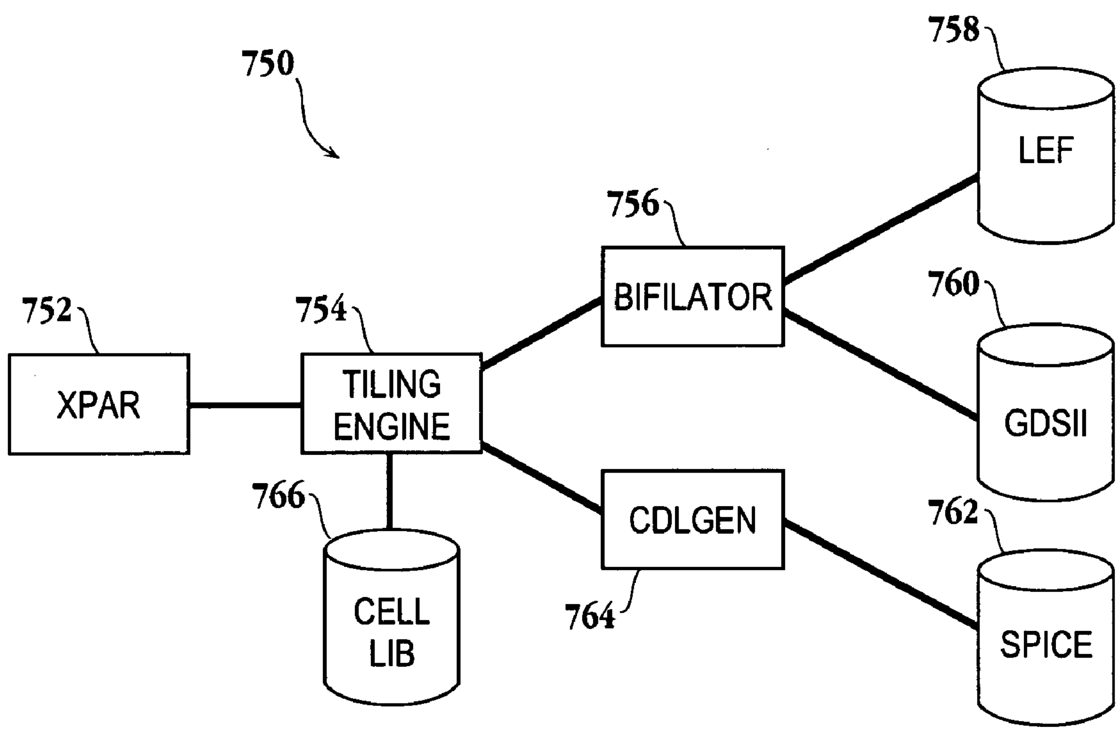
FIG. 6B is a block diagram showing an exemplary memory generator backend 750, in accordance with an embodiment of the present invention.

FIG. 6B is a block diagram showing an exemplary memory generator backend 750, in accordance with an embodiment of the present invention. The memory generator backend 750 comprises an XPAR process 752, a tiling engine 754, a Bifilator process 756, a CDLGEN process 764, and a cell library 766. Generally speaking, these processes function together to generate a LEF model 758, a GDSII model 760, and a SPICE model 762 for the particular memory application. The LEF model 758 comprises place and route information, which is utilized by routers to manufacture integrated circuits. The GDSII model 760 comprises mask layouts and is utilized by semiconductor foundries. The SPICE model 762 includes circuit interconnection definitions, operational properties, and schematic diagrams of the memory application. Thus, the designer can use the SPICE model of the application for cross verification.

As mentioned above, the exemplary memory generator backend 750 processes the data received via the GUI front end 700. More specifically, the XPAR process 752 encapsulates the rules needed to utilize particular cell layouts stored in the cell library. These rules, along with the parameter data for the memory application are then provided to the tiling engine 754 for optimization and cell placement. By separating the functions of the XPAR process 752 from those of the tiling engine 754, individual rules can be altered for specific applications without altering the functions and placement algorithms utilized in the timing engine 754.

The Bifilator process 756 generates an interface around a particular device or memory array. Generally, on a RAM there may exist over one thousand routing points for interfacing with the RAM. As a result, the entire routing configuration may change when a user changes the placement of the RAM, requiring intense reconfiguration. To address this issue, the Bifilator process 756 builds an interface around the RAM, which the user can use to interface with the RAM without configuring each routing point.

The present invention may be implemented using any type of integrated circuit logic, state machines, or software driven computer-implemented operations. By way of example, a hardware description language (HDL) based design and synthesis program may be used to design the silicon-level circuitry necessary to appropriately perform the data and control operations in accordance with one embodiment of the present invention.

The invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general purpose computer selectively activated or configured by a computer program stored in the computer. In particular, various general purpose machines may be used with computer programs written in accordance with the teachings herein, or it may be more convenient to construct a more specialized apparatus to perform the required operations. Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A memory circuit, comprising:

a memory core having an array of core cells, the core cells being defined by a plurality of rows and columns;

a redundant column containing core cells, the redundant column juxtaposing the memory core and extending substantially parallel with the plurality of columns of the memory core;

an X decode circuitry region for addressing rows of the memory core and the redundant column, the X decode circuitry region extending with and adjacent to the redundant column;

Y decode circuitry for addressing columns within an IO bit of the memory core, the Y decode circuitry including pre-charge circuitry;

a control circuit;

input/output (IO) circuitry associated with each IO bit, the IO circuitry directly being configured to route an access request intended for a defective core cell to the redundant column, a select signal activating an enable buffer and multiplexer of the IO circuitry to read from or write to a core cell of the redundant column; and sense amplifier circuitry coupled to each IO bit and the redundant column.

2. The memory circuit as recited in claim 1, wherein the select signal is generated in response to recognition of an access of the defective core cell as specified by address inputs to the memory.

3. A memory circuit, comprising:

a memory core having an array of core cells, the core cells being defined by a plurality of rows and columns;

a redundant column containing core cells, the redundant column juxtaposing the memory core and extending substantially parallel with the plurality of columns of the memory core;

an X decode circuitry region for addressing rows of the memory core and the redundant column, the X decode circuitry region extending with and adjacent to the redundant column;

Y decode circuitry for addressing columns within an IO bit of the memory core, the Y decode circuitry including pre-charge circuitry;

a control circuit;

input/output (IO) circuitry associated with each IO bit, the IO circuitry directly being configured to route an access request intended for a defective core cell to the redundant column;

sense amplifier circuitry coupled to each IO bit and the redundant column; and a dummy column adjacent to the redundant column.

4. The memory circuit as recited in claim 1, further including, a select lines region, the select lines region generating a select signal to activate enable circuitry for accessing the redundant column;

a logic region, the logic region containing logic circuitry for controlling the select lines region, and a fuse box for programming in locations of defective cells.

5. The memory circuit as recited in claim 4, wherein the select lines region, the logic region and the fuse box are located externally from the memory core cell.

6. The memory circuit as recited in claim 1, wherein the redundant column is one of a single column and a plurality of redundant columns.

7. The memory circuit as recited in claim 1, further including, a select lines region, the select lines region generating a select signal to activate enable circuitry for accessing the redundant column;

a logic region, the logic region containing logic circuitry for controlling the select lines region;

a Built In Self Repair (BISR), the BISR configured to locate and repair the defective core cell.

8. The memory circuit as recited in claim 7, wherein the BISR is in communication with a storage register, the storage register configured to store the address of the defective core cell.

9. A split-core design memory circuit, comprising:

a first memory core having an array of core cells, the core cells being defined by a plurality of rows and columns;

a second memory core having an array of core cells, the core cells being defined by a plurality of rows and columns;

a redundant column containing core cells, the redundant column juxtaposing at least one of the first memory core and the second memory core and extending substantially parallel with the plurality of columns of the memory core;

an X decode circuitry region for addressing rows of the first and second memory cores and the redundant column, the X decode circuitry region extending with and adjacent to the redundant column;

Y decode circuitry for addressing physical columns of an IO bit within the first and second memory cores, the Y decode circuitry including pre-charge circuitry;

a control circuit;

IO circuitry associated with each IO bit, the IO circuitry including enable circuitry directly being configured to route an access request intended for a defective core cell to the redundant column; and sense amplifier circuitry coupled to each IO bit and the redundant column.

10. The split-core design memory circuit as recited in claim 9, wherein a select signal activates an enable buffer and multiplexer of the IO circuitry to read from or write to a core cell of the redundant column.

11. The split-core design memory circuit as recited in claim 9, wherein a dummy column is adjacent to the redundant column.

12. The split-core design memory circuit as recited in claim 9, further including, a select lines region, the select lines region generating a select signal to activate enable circuitry for accessing the redundant column;

a logic region; the logic region containing logic circuitry; and a fuse box.

13. The split-core design memory circuit as recited in claim 12, wherein the select lines region, the logic region and the fuse box are located externally from the memory core cell.

14. The split-core design memory circuit as recited in claim 9, wherein the redundant column is a plurality of redundant columns.

15. The split-core design memory circuit as recited in claim 10, wherein the enable buffer is a tri-state buffer.

16. The split-core design memory circuit as recited in claim 9, further including, a select lines region, the select lines region generating a select signal to activate enable circuitry for accessing the redundant column;

a logic region, the logic region containing logic circuitry; and a Built In Self Repair (BISR), the BISR configured to locate and repair the defective core cell.

17. The split-core design memory circuit as recited in claim 16, wherein the BISR is in communication with a storage register, the storage register configured to store the address of the defective core cell.

18. A split-core design memory circuit, comprising:

a first memory core having an array of core cells, the core cells being defined by a plurality of rows and columns;

a second memory core having an array of core cells, the core cells being defined by a plurality of rows and columns;

a redundant column containing core cells, the redundant column juxtaposing at least one of the first memory core and the second memory core and extending substantially parallel with the plurality of columns of the memory core;

a dummy column, the dummy column adjacent to the redundant column; and

IO circuitry associated with each IO bit, the IO circuitry directly being configured to route an access request intended for a defective physical column to the redundant column.

19. The split-core design memory circuit as recited in claim 18, wherein one of the pre-charge circuitry, the sense amplifier and the IO circuitry region for the redundant column extends horizontally so as to occupy chip area being defined under the redundant column and the dummy column.

20. A memory circuit as recited in claim 18, wherein a second dummy column is located on an opposing side of one of the first memory core and the second memory core.

21. The split-core design memory circuit as recited in claim 18, wherein dummy columns surround the first and second memory core.

22. The split-core design memory circuit as recited in claim 18, further including, a select lines region, the select lines region generating a select signal to activate enable circuitry for accessing the redundant column;

a logic region, the logic region containing logic circuitry;

a Built In Self Repair (BISR), the BISR configured to locate and repair the defective core cell.

23. The split-core design memory circuit as recited in claim 22, wherein the BISR is in communication with a storage register, the storage register configured to store the address of the defective core cell.

24. A method for routing an access request to a defective column in an array of a memory circuit, comprising:

providing a plurality of redundant columns adjacent to the memory core within a memory circuit, the redundant columns in communication with a sense amplifier;

locating a defective column within an array of a memory circuit;

programming an address associated with the defective column;

processing an access request, the access request directed for the defective column in the memory circuit; and routing the access request to the redundant columns through enable circuitry at an Input/Output (IO) level within the memory circuit.

25. The method for routing an access request to a defective column in an array of a memory circuit as recited in claim 24, wherein the programming of a defective column address within an array of a memory circuit further comprises, utilizing a Built In Self Repair to locate and repair the defective column.

26. The method for routing an access request to a defective column in an array of a memory circuit as recited in claim 24, wherein the routing the access request to the redundant column within the memory circuit further comprises, generating a select signal, the select signal being configured to activate the enable circuitry, the enable circuitry allowing access to the redundant column when activated.

27. The method for routing an access request to a defective column in an array of a memory circuit as recited in claim 24, wherein the programming the address of a defective column further comprises, blowing selected fuses of a fuse box with a laser.

28. The method for routing an access request to a defective column in an array of a memory circuit as recited in claim 25, wherein the BISR is in communication of a storage register, the storage register being configured to store addresses of defective columns.

* * * * *